United States Patent [19]

Zarowin et al.

[11] Patent Number: 5,291,415
[45] Date of Patent: Mar. 1, 1994

[54] METHOD TO DETERMINE TOOL PATHS FOR THINNING AND CORRECTING ERRORS IN THICKNESS PROFILES OF FILMS

[75] Inventors: Charles B. Zarowin, Rowayton; L. David Bollinger, Ridgefield, both of Conn.

[73] Assignee: Hughes Aircraft Company, Los Angeles, Calif.

[21] Appl. No.: 807,544

[22] Filed: Dec. 13, 1991

[51] Int. Cl.$^5$ ............................................. G06F 15/46
[52] U.S. Cl. ................................ 364/474.3; 156/626; 156/643
[58] Field of Search ................ 364/474.15, 474.3, 563; 156/625, 626, 643; 204/192.1, 192.11, 192.13

[56] References Cited

U.S. PATENT DOCUMENTS

| | | | |
|---|---|---|---|
| 4,618,262 | 10/1986 | Maydan et al. | 356/357 |
| 4,758,304 | 7/1988 | McNeil et al. | 156/626 |
| 4,860,229 | 8/1989 | Abbe et al. | 364/563 |
| 4,877,479 | 10/1989 | McNeil et al. | 156/626 |
| 4,915,757 | 4/1990 | Rando | 156/64 |
| 4,928,257 | 5/1990 | Yerkes et al. | 364/563 |
| 4,931,982 | 6/1990 | Hayashida | 364/473 |

OTHER PUBLICATIONS

*Solid State Technology*, vol. 34, No. 9, Sep. 1991; pp. 57–59, "Film Thickness Mapping System".

*Primary Examiner*—Jerry Smith
*Assistant Examiner*—Paul Gordon
*Attorney, Agent, or Firm*—Michael W. Sales; Wanda K. Denson-Low

[57] ABSTRACT

A method to determine the tool path of a material removal tool which is part of a system to shape the surface of a substrate is disclosed. The method conditions initial metrology data of the substrate into a dwell time versus position on the surface for the removal tool. The dwell time array is subsequently converted into a velocity versus position array so that a position controller means may be utilized to guide the movement of the substrate with respect to the removal tool to perform precise material removal on the surface of the substrate.

27 Claims, 5 Drawing Sheets

SIGNAL PLASMA TOOL
REMOVAL PROFILE

FIG. 4a.  AMPLITUDE (DEPTH) A
FUNCTION OF DWELL
TIME (TOOL VELOSITY)

CLOSELY
OVERLAYED
TOOL PATTERNS

FIG. 4b. EQUAL AMPLITUDES
↓
 UNIFORM REMOVAL OF FILM

FIG. 4c. MODULATE AMPLITUDES
 ↓

FIG. 4d.
 CHANGE IN FILM THICKNESS PROFILE

METHOD TO DETERMINE TOOL PATHS FOR THINNING AND CORRECTING ERRORS IN THICKNESS PROFILES OF FILMS

BACKGROUND OF THE INVENTION

1. Field of the Invention

The present invention relates to a system to shape the surface of a substrate, namely, to thin and modify films, and more particularly, to a method for determining the path for a plasma assisted chemical etching material removal tool to thin and modify the thickness profile of an existing substrate layer. The present invention provides a means to obtain a layer of uniform and specified thickness from a layer having a measured, but non-uniform thickness profile.

2. Description of the Prior Art

Substrate materials with thin solid layers, such as silicon-on-insulator (SOI) wafers, and films are used extensively in the fabrication of electronic, optical, magnetic, superconducting and other important technological devices. Such substrates are often subjected to figuring and thinning processes which remove some of the material from the surface. Along with describing conventional material removal processes, a system for removing material from the surface of an SOI wafer is described in a related patent application entitled "System for Removing Material from a Wafer", U.S. patent application Ser. No. 07/696,897, filed on May 7, 1991. The system disclosed therein includes a means for determining thickness profile data for a surface of a wafer, means for converting the thickness profile data to a dwell time versus position map stored in a system controller and a means for removing material from the surface of the wafer in accordance with the map such that the wafer has a preselected thickness profile.

The present invention is directed toward a method used to determine the paths that the removal tool must make over the wafer to thin the wafer to a uniform thickness or a desired profile.

SUMMARY OF THE INVENTION

The present invention relates to a system to shape the surface of a substrate, and more particularly, to a method to thin and modify semiconductor films for the production of silicon-on-insulator (SOI) wafers. The present invention provides a method to determine the path a localized material removal tool comprising a plasma assisted chemical etching apparatus must make over the surface of the wafer to thin and modify the thickness profile of an existing layer, where the profile of the layer may be arbitrary but measurable, to another desired profile. The final thickness profile of the layer after processing by the removal tool utilizing the method of the present invention is independent of the overall surface shape (shape of the substrate to layer).

The present invention provides a means to specify the tool material removal shape, the tool removal dependence with tool velocity, and the amount of tool overlap necessary to construct a tool velocity versus position map for guiding the local material removal over the surface of the wafer to achieve the desired change in the film thickness profile. It performs this function using measured initial thickness profile data, desired film thickness profile data and the spatial material removal rate of the removal tool.

One objective of the present invention is to provide a method to thin and modify films by plasma assisted chemical etching apparatus.

Another objective of the present invention is to provide a method by which material removal paths can be determined to produce layers of material with desired thickness profiles more accurately and more rapidly.

Another objective of the present invention is to provide a method to obtain a layer of uniform and specified thickness from a layer having a measured, but non-uniform, thickness profile.

Other objects and advantages of the present invention will become apparent to those skilled in the art from the following detailed description read in conjunction with the attached drawings and claims appended hereto.

DETAILED DESCRIPTION OF THE PRESENT INVENTION

Figure 1:
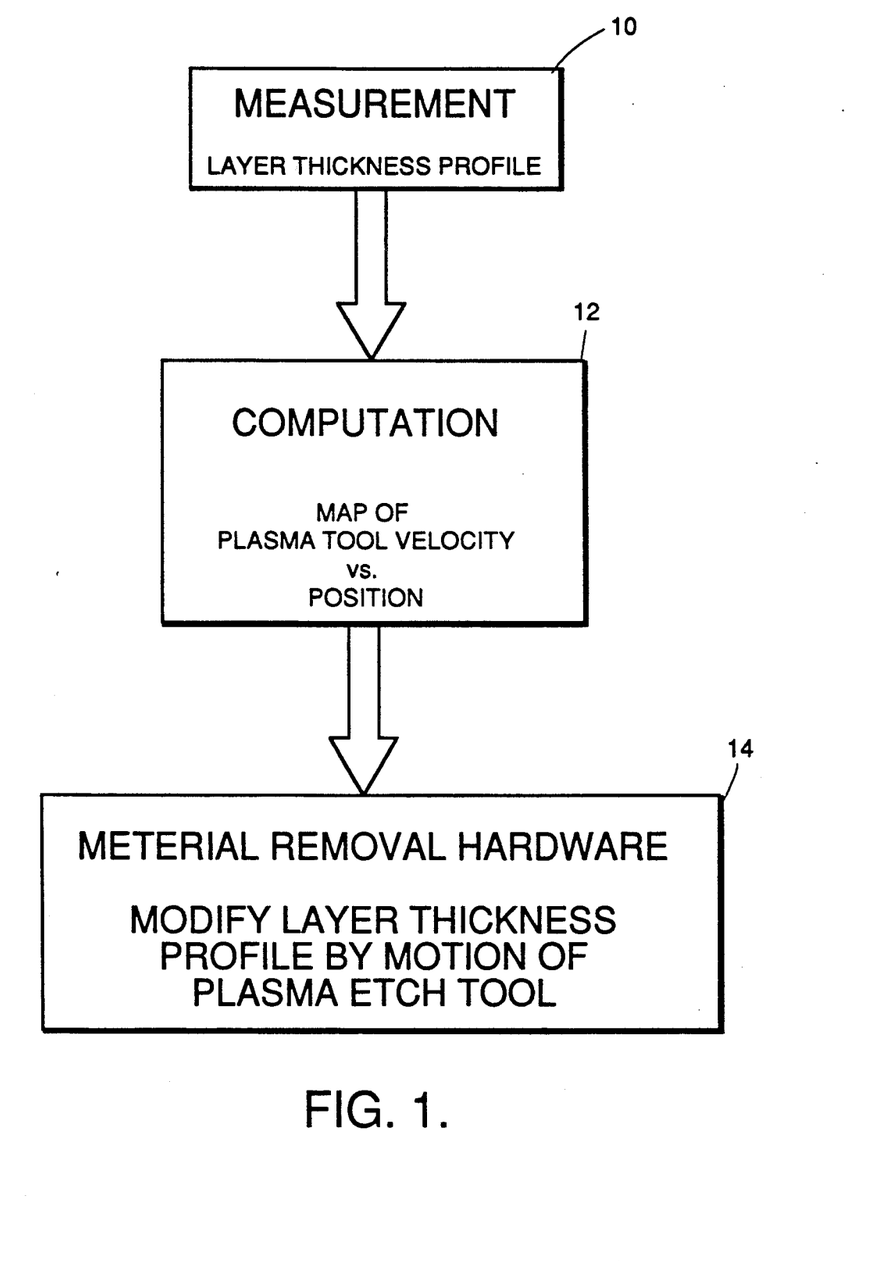
FIG. 1 is a flow diagram of the main components of a system for modifying the thickness of an SOI wafer.

A system to modify the thickness profile of a layer by plasma assisted chemical etching is generally described in U.S. patent application Ser. No. 07/696,897 referenced above in the Description of the Prior Art. A flow diagram of the simplified process steps of the system to modify the thickness profile of a wafer is illustrated in FIG. 1. The process steps of the system invention generally comprise a metrology step 10 to measure and map the initial thickness layer profile of the substrate, a step 12 to compute a map relating plasma removal tool velocity to the position of the removal tool, and a step 14 to modify a substrate layer thickness profile by moving the removal tool means with respect to a substrate surface. The removal tool generally comprises a computer controlled plasma assisted chemical etching reactor (not shown) constructed so as to facilitate local material removal. The shape and characteristics of the plasma (the removal tool) produced by the apparatus is controllable by varying a number of parameters such as radio frequency power input, reactive gas compositions, flow rates and pressures, and the physical apparatus itself.

Figure 2:
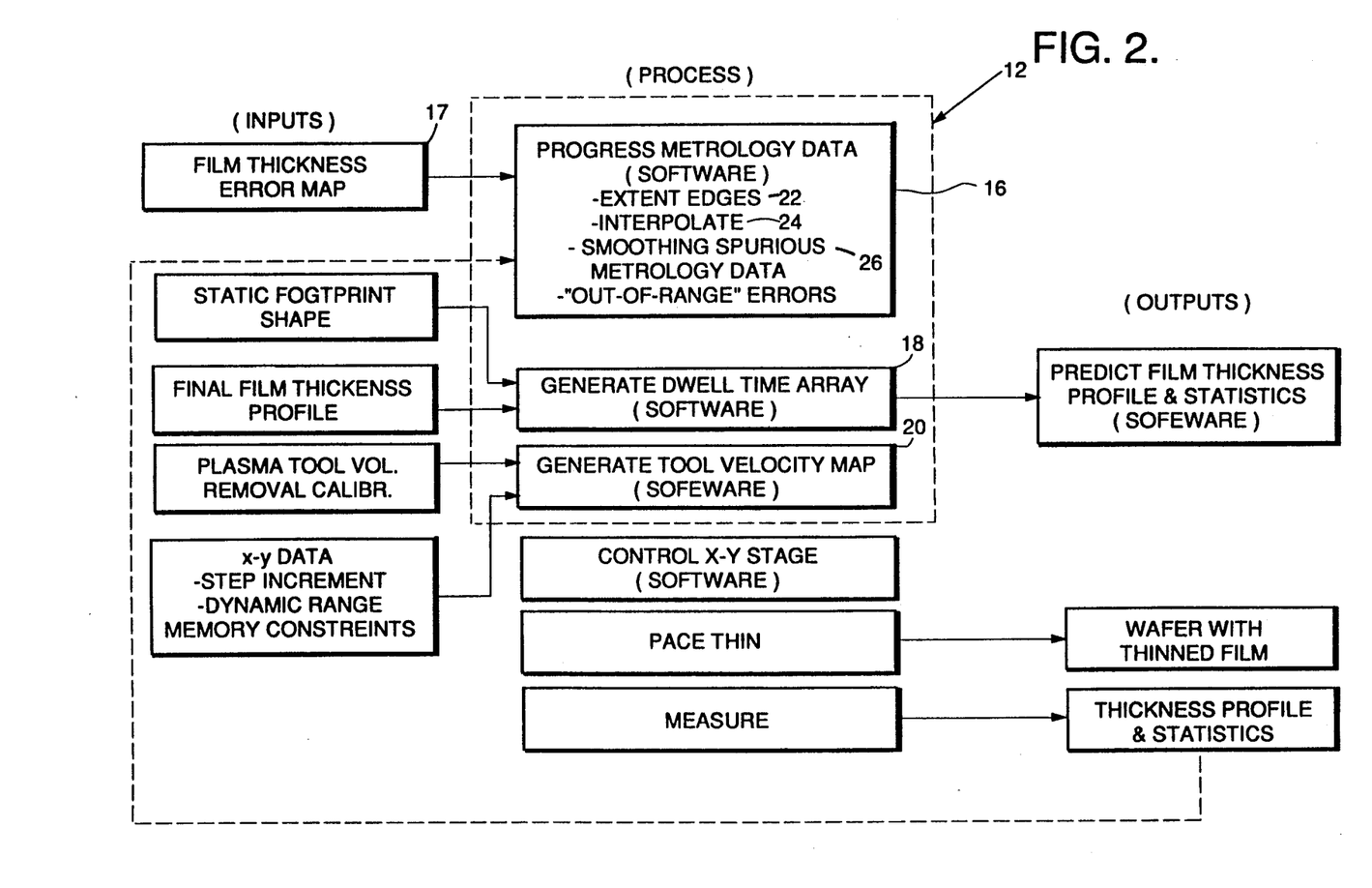
FIG. 2 is a flow diagram for determining the tool velocity map.

The present invention is directed to the system step 12 to determine the map relating the plasma removal tool velocity to the position of the tool required before performing the actual removal process. FIG. 2 shows a flow diagram of associated inputs, processing steps and outputs needed for the determination step 12. Referring to FIG. 2, the method of the present invention generally comprises the substeps of processing previously measured metrology data 16 in the form of a film thickness error map 17, generating a dwell time array 18 from the processed data, and generating a tool velocity map 20 from the array 18 for each position of the removal tool. Thus, by performing the above steps, the removal tool can be accurately guided and dynamically moved about the surface of the wafer to precisely excise material from the surface and fabricate a wafer with a uniform layer on it.

The processing metrology data step 16 generally comprises the substeps of extending film edge data 22, interpolating metrology data points 24 and smoothing spurious metrology data 26. The substep to extend the film edge data permits the system to avoid edge effects and allows the attainment of the desired target film thickness profile over the maximum possible area of the film.

Accurate thickness correction at the edge of the substrate is accomplished by commanding controlled continuous movement of the removal tool off the substrate as if the film being corrected is actually extended beyond the area over which thickness data is measured. Thus, to maintain controlled continuous motion off of the substrate, the film position/thickness data array constructed by the measurement step 10 must be extended a distance beyond the actual measured edge of the film. The distance must be at least the radius of a tool removal footprint and the extended data must fit the actual measured data smoothly. Otherwise, the resulting motion of the tool is discontinuous, although centered off of the film, and will feed back errors onto the corrected film through material removal of the trailing edge of the removal footprint which is still on the film. Continuous motion off the edge can be achieved by assuring that the extended data matches the magnitude and slopeof the film thickness error to be removed.

Figure 3A:
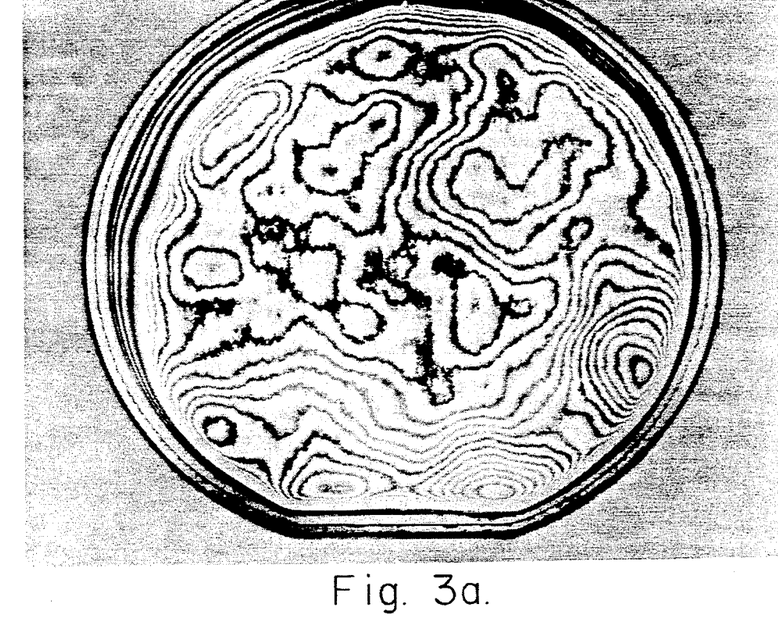
FIG. 3a is an interference fringe picture of a thinned silicon film thinned without using an algorithm for continuously extending the data at the edge of the film.
Figure 3B:
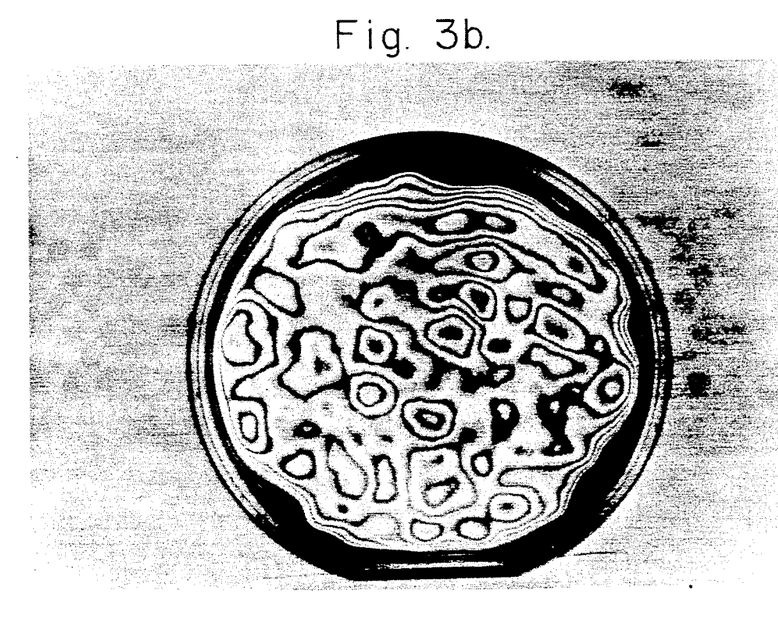
FIG. 3b is an interference fringe picture of a thinned silicon film thinned using an algorithm to extend the measured thickness data over the film area.

FIGS. 3a and 3b are interference fringe pictures of thinned silicon films taken in monochromatic light. The substrate in each figure is a 1 micron silicon dioxide layer on a 100 mm diameter silicon wafer. Each line represents a thickness change of 650 Å in the silicon film. Prior to thinning, each wafer's starting film thickness was about 4±1.5 microns which is nearly a 50 fringe variation. FIG. 3a shows a film thinned to about 0.3 microns without using an algorithm of the present invention for continuously extending the data at the edge of the film. The resulting velocity map did not command the tool to move smoothly off the film and the trailing part of the tool introduced thickness variations up to a tool radius in from the film edge as the center of the tool moved off the film edge.

FIG. 3b shows a film thinned using the algorithm of the present invention to extend the measured thickness data over the film area by radially extending the measured thickness values around the edge. FIG. 3b shows a number of concentric fringes along film. A the edge which indicate that there are much lower errors near the edge of the further improvement in the error at the edge may be gained by including provisions for matching the slope of the film thickness.

The step of generating a dwell time array 18, as discussed more fully below, requires a greater number of data points than are supplied by the metrology step 10 even though the resolution of the film thickness measurement points sufficiently samples the surface. Thus, the processing of the metrology data step of the present invention additionally comprises the use of an interpolation substep 24 to fill in film thickness values between measured points. Various interpolations methods may be used to fill in the values. For example, the simplest interpolation method which can be used with the present invention is a 2-dimensional linear interpolation. More representative interpolated values are obtained by performing a polynomial spline fit of the slope of the surface at each measured point. The film thickness profile corrections shown in FIGS. 3a and 3b were made from an error map 17 having data measurements of film thickness points spaced on a 5 mm grid spacing. The number of data points was subsequently increased five fold by interpolation so as to reduce the spacing between data points to 1 mm.

The film thickness error map 17 may have spurious data or actual thickness data that represents film thickness errors that are beyond the capability of the system to accurately correct due to limitations in the removal tool with respect to the surface. For example, such errors may result from discontinuous edges of the substrate. The data from the map 17 is smoothed and filtered by a smoothing substep 26. Smoothing is accomplished by eliminating the effects of spurious data and/or limiting the change in the slope of the thickness to be corrected. The effects of spurious data may be eliminated by averaging multiple measurements and additionally, throwing out data which differs from the average at a given point by more than a predetermined value. Change in the slope of the film thickness, as given by the measured data, can be limited by imposing a maximum value to the difference value between the thickness at a given point and the average of the surrounding measured thickness values. The smoothing substep insures that when the correction to the film profile is performed, the removal tool accurately responds to motion commands from a controller supplied with tool velocity data. Also, such smoothing methods insure that secondary errors are not introduced into the film to correct false errors or errors with a spatial frequency content too high for the material removal tool to correct (i.e. spatial errors within an area much smaller than the tool removal footprint size).

As stated above, after the metrology data has been processed, the processed data is used to generate a dwell time array in substep 18. The dwell time calculation made by this substep uses the processed film thickness data, the inputs of a material removal footprint shape and a target film thickness profile to calculate a map of dwell times for the material removal tool as a function of removal tool position. The calculation of the dwell time map is necessary for building a velocity map to provide guidance to a means for moving the substrate with respect to the removal tool when making the corrections to the thickness of the film.

As stated above the calculated dwell time data points are spaced closer than the footprint size of the material removal tool. This spacing arrangement reduces the sensitivity of the removal tool footprint to the exact shape of the material removal footprint and allows a more accurate prediction of the material removal dwell time obtained by continuous tool velocity. A 1 mm grid spacing for the dwell time map was used for the thinned silicon films in FIGS. 3a and 3b. The removal tool footprint defined by the plasma shape was 13 mm wide at half the maximum removal depth.

When the tool footprint size is much smaller than a representative dimension of the size of the film thickness errors to be corrected, an accurate dwell time map is obtained by allowing the dwell time to be proportional to the error itself. When correcting for errors having characteristic dimensions on the order of the footprint size, an accurate dwell time is obtained by explicitly accounting for the footprint shape.

A dwell time map which accounts for the footprint shape can be calculated by a number of methods. However, whatever the method used for calculation, the method must take into account computational speed and accuracy tradeoffs. One method starts with a dwell time approximation proportional to the film thickness error and then makes corrections to the approximation based on the footprint shape. This method, where the initial dwell time is proportional to the film thickness error, can be viewed as a method that enhances the error map by exaggerating the higher spatial frequency errors so as to efficiently correct the errors with the removal tool. The solution to this method can be implemented in several ways.

An iterative solution starts with a dwell time proportional to the error at any point. The solution simulates the thickness profile that would be obtained with a dwell time map represented by $T0(x,y)$, where $T0(x,y)$ is the dwell time at point $x,y$, derived by convolving $T0(x,y)$ with the foot print shape using techniques known to those skilled in the art. Next, the residual error after simulation, $Er(x,y)$, where $Er(x,y)$ is the error at point $(x,y)$, is computed by subtracting the simulated thickness profile from the starting measured film thickness error. Following the residual error computation, the starting dwell time is scaled by the calculated residual error to give a corrected dwell time map, $T1(x,y)$ where $T1$ is the corrected dwell time at point $x,y$. The corrected dwell time for a point, $T1(x,y)$, is obtained by solving the equation:

$$T1(x,y) = T0(x,y)[1+Er(x,y)].$$

The scaling procedure inherently accounts for the footprint shape in the convolution of the measured footprint shape with the initial dwell time estimate, $T0(x,y)$, to obtain a correction, $Er(x,y)$. Additional simulated iterations and dwell time rescaling can be done to obtain greater accuracy for the dwell time map while the number of iterations actually used is dictated by computer speed limitations and overall time constraints.

A local surface error correction solution to the method for determining dwell time adjusts $T0(x,y)$ based on the local film thickness error. However, the higher the spatial frequency of the film thickness error in the region of point $(x,y)$, the larger the adjustment to $T0(x,y)$. The adjustment is calculated from the shape of the film thickness error over a region characteristic of the footprint area. It should be recognized that the footprint shape needs to be accounted for only when the film thickness error has a spatial curvature, and, thus, simple piston (cylindrically shaped substrates surface discontinuities) or tilt errors in the film thickness are corrected exactly by $T0(x,y)$. A more accurate dwell time, $T'1(x,y)$ is obtained by adding a term $C(x,y)$ which is subject to the local, spatial dependence on the film thickness error. Thus, the more accurate dwell time, $T'1$, is determined by solving the equations $T'1(x,y) = T0(x,y) + C(x,y)$ and $C(x,y) = k[E(x,y) - Eave(s;x,y)]$, where k is a proportionality constant determined from the footprint shape and which can be further refined from the measured accuracy of film thickness profiles after correction, $E(x,y)$ is the film thickness error value at point $(x,y)$ and $Eave(s;x,y)$ is an average value of the thickness error at a surrounding characteristic distance, s. To reflect the footprint shape, s is of the order of the footprint size (the width at half of maximum removal).

Generally, dwell times may be calculated in real, physical space or Fourier space (spatial frequency domain). Calculations with Fourier transforms add the advantage of increasing computation speed when array sizes are large since integrations can be performed as multiplications.

Figure 4A:
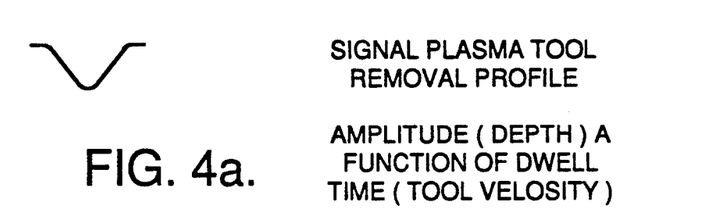
FIG. 4a is a cross-sectional view of the profile for a material removal tool.
Figure 4B:
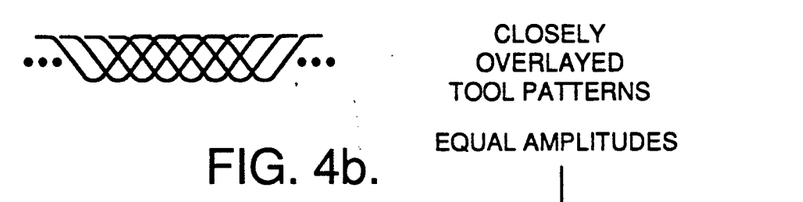
FIG. 4b is a cross-sectional view of overlapping profiles achieved by moving the removal tool a small distance for each successive pass in a single direction.
Figure 4C:
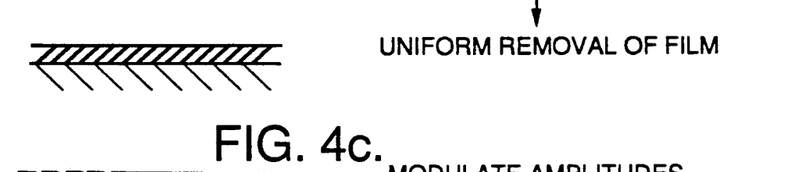
FIG. 4c is a cross-sectional view of the surface of the wafer after the removal tool has scanned over the surface while utilizes an overlapping scan.
Figure 4D:
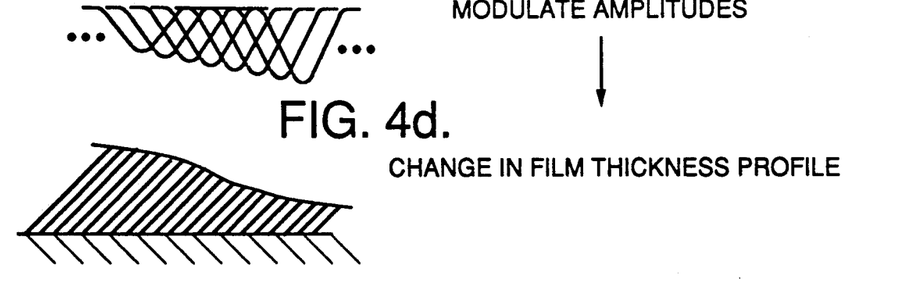
FIG. 4d is a cross-sectional view of a tool path selection where the removal tool parameters are changed with each successive pass in a single direction

Referring to FIG. 2, once the dwell time map has been generated by substep 18 a tool path must be determined to satisfy the map. To satisfy the tool path determination, a substep 22 must be performed to calculate a tool velocity map. Similar to the calculation for the dwell map, using a spacing between calculated data points much smaller than the footprint size reduces the sensitivity to the exact shape of the material removal footprint when correcting the error in the film thickness. Tool scans of the surface of the substrate must overlap. Correspondingly, the increment between overlapping tool scans as determined by the tool path calculation should be much less than the diameter of the tool foot print shown in FIG. 4a. By keeping the increment small, "ripple" effects introduced into the film thickness from overlapping tool scans can be made arbitrarily small ($<1$ Å). For a small increment between scans, the summed removal depth, D, is related to the increment step dx by $$D = A/dx$$

where A is a constant that depends on the volume removed by the tool. Thus, referring to FIGS. 4a, 4b, and 4c, programmed control of the depth of removal when scanning the removal tool over the surface of the substrate can be obtained by varying the tool velocity. Utilizing a uniform tool velocity with a small step increment between tool scans yields a uniform removal from the surface. Referring to FIG. 4d, by varying the tool velocity to meet the calculated dwell time map conditions, an arbitrary correction to the film thickness profile is achieved.

The wafers shown in FIGS. 3a and 3b were thinned using an x-y scan. Other tool paths such as circular paths or spiral paths could be used provided the calculated velocity map is consistent with the dwell time map. Film thickness can be more precisely controlled if the tool is allowed to move continuously off of the film as described above. The path chosen for the removal tool should extend at least one tool radius off of the edge of the film.

The material removal must be calibrated to the calculated dwell time units to satisfy the dwell time map. The calibration must include the dependence of the material removal on tool velocity and the magnitude of the calculated dwell time units must be correlated to the actual removal by the tool.

Figure 5A:
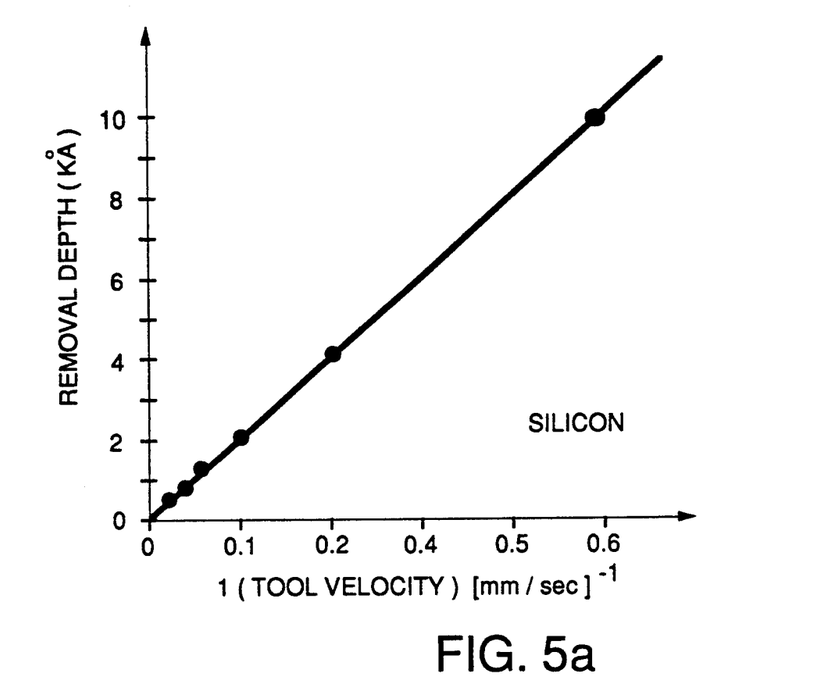
FIG. 5a is a graph of material removal dependence on plasma etching tool velocity for silicon showing linear dependence on inverse velocity.
Figure 5B:
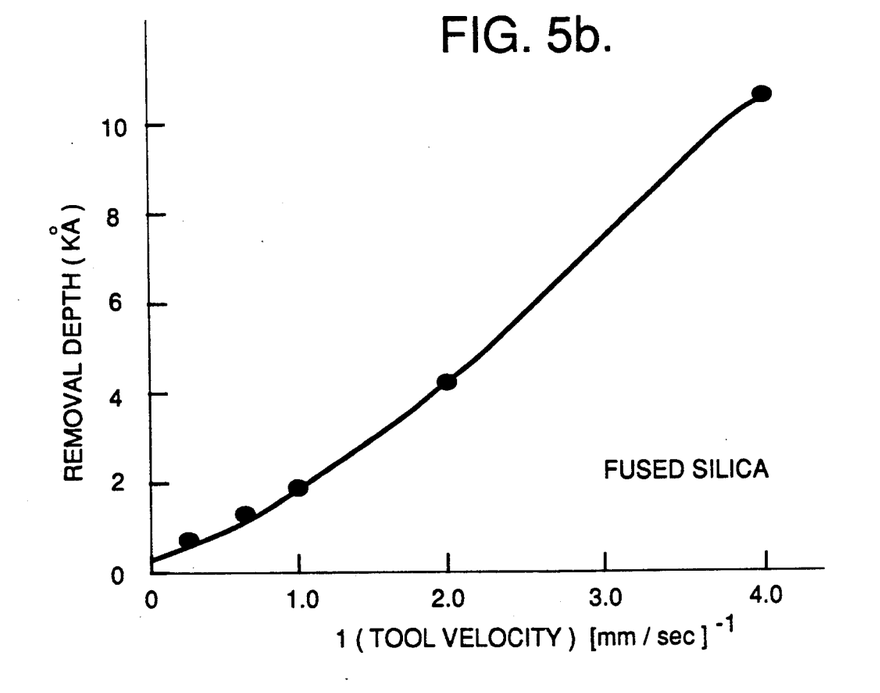
FIG. 5b is a graph of material removal dependence on plasma etching tool velocity for silicon dioxide a non-linear dependence on inverse velocity.

Because tool velocity is used to provide a dwell time or conversely dwell time is used to provide tool velocity, the dependence of material removal is expressed as an inverse of tool velocity. Generally the dependence relationship is non-linear. FIGS. 5a and 5b show material removal dependencies on plasma etching tool velocity for silicon and fused silica. Referring to FIG. 5a, the measured dependencies under set plasma parameters for silicon are plotted. FIG. 5a shows that the dependence for silicon is linear. FIG. 5b shows that the dependence for fused silica is non-linear as is the case for most materials. The removal depth data can be fit to measured points over the velocity range to analytically describe the dependence.

As stated above, the magnitude of the calculated dwell time units must be correlated to the actual tool removal. This can be accomplished by comparing the predicted volume removal in the calculated dwell time units to the actual, measured tool volume removal. Tool volume removal can be experimentally derived from a uniform removal with closely overlapped tool scans at a uniform velocity. The dwell time calculation can give a volume removal prediction by integrating the static tool removal shape over its area.

When making a correction to the film thickness profile, the tool velocity required must be achievable by the actual hardware. Velocities specified by the tool velocity map to meet the calculated dwell times must be within the dynamic range of apparatus controlling the tool to substrate velocity. The velocity range required by the dwell time map can be shifted to be within the dynamic range of the hardware by changing the increment, dx, between scans. For example, reducing dx by a factor of two decreases the tool velocity by a factor of two (assuming removal is linear with tool velocity), thus changing the velocity range required. The velocity range can be shifted to be within the dynamic range of the hardware by changing the process volume removal rate. This is accomplished by changing the tool removal rate parameters (i.e., rf power, gas pressure, gas mixture). For example, doubling the volume removal rate decreases the tool velocity required by a factor of two.

To meet calculated dwell time requirements, other parameters may be programmed to vary the instantaneous tool removal depth provided the removal rate has a rapid, controllable response to the changing parameter. For example, varying the rf power gives a rapid and well defined removal rate response. Programmed control of the rf power provides a means to correct film thickness, and when used in conjunction with the tool velocity is a means to extend the dynamic range of the tool.

Thus what has been described is a method for determining the tool path for a material removal tool so as to provide a means to make corrections to the surface of a substrate. The method disclosed herein provides the required information to drive the stage controller providing a means to guide the removal tool over the substrate surface so that precise material removal can be made and a uniform layer on a wafer can be obtained.

What is claimed is:

1. A method for determining a path of a removal tool of a system to remove material from a surface of a substrate so as to allow precision changes to be made in a thickness profile of the substrate, said method comprising the steps of:
   a) constructing a conditioned data array from a pre-removal process thickness data array, said conditioned data array comprising substrate thickness data as a function of position on a coordinate plane so as to provide a means for insuring continuous and smooth tool movement over the entire surface of the substrate;
   b) constructing a dwell time array relating dwell time for the removal tool as a function of position on the coordinate plane from said conditioned data array;
   c) converting the dwell time array into a multi-directional velocity array relating multi-directional velocity for the removal tool as a function of position on the coordinate plane; and
   d) communicating said multi-directional velocity array to a position controller so as to allow continuous and controlled motion of the removal tool.

2. The method of claim 1, wherein the step of constructing the conditioned data array further comprises the step of extending the data array beyond an edge of the substrate to provide extended data points so as to further allow continuous guided movement of the removal tool beyond the substrate surface.

3. The method of claim 2, wherein extension of the data array is at least the distance of a footprint of the removal tool.

4. The method of claim 2, wherein the step of extending the data array further comprises a step to account for a slope of the thickness profile at the edge of the substrate and a step to include said slope into the extended data points.

5. The method of claim 4, wherein the accounting step is performed by numerically fitting the data points near the substrate edge.

6. The method of claim 1, wherein the conditioning step further comprises a step to increase the number of data points of the pre-removal process thickness versus position data array.

7. The method of claim 6, wherein the step to increase the number of data points is performed by interpolation of existing points in the data array.

8. The method of claim 7, wherein the method of interpolation is a two dimensional linear interpolation.

9. The method of claim 7, wherein the method of interpolation is a polynomial spline fit.

10. The method of claim 1, wherein the conditioning step further comprises a step to smooth spurious data and substrate thickness data that is beyond the capability of the system to accurately correct due to limitations of the removal tool.

11. The method of claim 10, wherein the smoothing step comprises averaging multiple thickness measurements.

12. The method of claim 10, wherein the smoothing step comprises limiting an allowable change in the slope of the thickness profile.

13. The method of claim 10, wherein the smoothing step comprises averaging multiple thickness measurements and limiting an allowable change in the slope of the thickness profile.

14. The method of claim 1, wherein the step of constructing the dwell time array further comprises the steps of setting an initial dwell time for a point on the dwell time array proportional to a film thickness error at that point and repeating said step to obtain an initial dwell time versus the position on the dwell time array.

15. The method of claim 14, wherein the step of constructing the dwell time array further comprises the steps of simulating the thickness profile obtained with an initial dwell time array, comparing the simulated profile with a desired profile to obtain a residual error for each point, and scaling the initial dwell time array by the residual error to obtain a corrected dwell time array.

16. The process of claim 15, wherein the steps are repeated in an iterative fashion to achieve a desired accuracy.

17. The method of claim 14, wherein the construction step of constructing the dwell time array step further comprises the step of adjusting the initial dwell time of the film thickness error to account for its local, spatial dependence.

18. The method of claim 17, wherein the adjusting step comprises adding a difference to each point on the initial dwell time array, further adjusted by characteristics of the footprint of the removal tool, between the film thickness error at each point and the average film thickness error for points located within a predetermined distance S from each point.

19. The method of claim 18, wherein the adjustment is repeated for each point on the dwell time array.

20. The method of claim 1, wherein the dwell time array is converted to a velocity data array by transposing dwell time data into velocity data determined as a function of removal depth.

21. A method for determining a path for a removal tool of a system to remove material from a surface of a substrate so as to allow precision changes to be made in a thickness profile of the substrate, said method comprising the steps of:
 a) constructing a conditioned data array from a pre-removal process thickness data array comprising substrate thickness data as a function of position on a coordinate plane to provide continuous and smooth tool movement over the surface of the substrate in accordance with the substeps of:
  1) extending the data array beyond an edge of the substrate by at least a distance corresponding to a footprint of the removal tool, and accounting for a slope of the thickness profile at the edge of the substrate into said extended data array,
  2) increasing the number of data points of the pre-removal process thickness data array by interpolating measured data points, and
  3) smoothing spurious data and thickness data which is beyond the capability of the system to accurately correct due to limitations of the removal tool;
 b) constructing a dwell time array relating dwell time for the removal tool as a function of position on the coordinate plane from said conditioned data array in accordance with the substeps of:
  1) setting an initial dwell time for a point on the dwell time array proportional to film thickness error at that point and repeating this step to obtain an initial dwell time for each point of the conditioned array,
  2) simulating a post-processing thickness profile of the substrate that would be obtained with the initial dwell time array by comparing the simulated profile with a desired profile to obtain a residual error for each point, and scaling the initial dwell time array by the residual error to obtain a corrected dwell time array, and
  3) repeating the simulation step in an iterative fashion to achieve a desired accuracy;
 c) converting the dwell time array into a multi-dimensional array relating velocity of the removal tool as a function of position to a desired removal depth; and
 d) communicating said multi-dimensional velocity array to a position controller so as to allow continuous and controlled motion of the removal tool.

22. The method of claim 21, wherein the multi-dimensional velocity array is two-dimensional.

23. The method of claim 1, wherein the coordinate plane is Cartesian.

24. A method for determining a path of a removal tool of a system to remove material from a surface of a substrate so as to allow precision changes to be made in a thickness profile of the substrate, said method comprising the steps of:
 a) generating a conditioned data array comprising substrate thickness data as a function of position;
 b) generating from said conditioned data array a dwell time array relating dwell time for the removal tool as a function of position;
 c) converting the dwell time array into a velocity array relating velocity of the removal tool as a function of position; and
 d) communicating said velocity array to a position controller that is adapted to control movement of the removal tool.

25. The method of claim 24 wherein the step of constructing the conditioned data array further comprises the step of extending the data array beyond an edge of the substrate to provide extended data points to allow continuous guided movement of the removal tool beyond the substrate surface.

26. The method of claim 24, wherein the step of constructing the dwell time array further comprises the steps of setting an initial dwell time for a point on the dwell time array proportional to a film thickness error at that point and repeating this step to generate an initial dwell time versus the position on the dwell time array.

27. The method of claim 24, wherein the step of constructing the dwell time array further comprises the steps of simulating the thickness profile obtained with an initial dwell time array, comparing the simulated profile with a desired profile to obtain a residual error for each point, and scaling the initial dwell time array by the residual error to generate a corrected dwell time array.

* * * * *